US008674375B2

(12) United States Patent
Denbaars et al.

(10) Patent No.: US 8,674,375 B2
(45) Date of Patent: *Mar. 18, 2014

(54) ROUGHENED HIGH REFRACTIVE INDEX LAYER/LED FOR HIGH LIGHT EXTRACTION

(75) Inventors: Steven P. Denbaars, Goleta, CA (US); James Ibbetson, Santa Barbara, CA (US); Shuji Nakamura, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 541 days.

This patent is subject to a terminal disclaimer.

(21) Appl. No.: 11/187,075

(22) Filed: Jul. 21, 2005

(65) Prior Publication Data

US 2007/0018183 A1  Jan. 25, 2007

(51) Int. Cl.
*H01L 27/15* (2006.01)
*H01L 29/26* (2006.01)
*H01L 31/12* (2006.01)
*H01L 33/00* (2010.01)

(52) U.S. Cl.
USPC .......... 257/79; 257/94; 257/98; 257/103; 257/E33.001; 257/E33.008; 257/E33.012; 257/E33.013; 257/E33.023; 257/E33.025; 257/E33.034

(58) Field of Classification Search
USPC ........ 257/79, 94, 98, 103, E33.001, E33.008, 257/E33.012, E33.013, E33.023, E33.025, 257/E33.028, E33.03, E33.033, E33.034, 257/E33.049
See application file for complete search history.

(56) References Cited

U.S. PATENT DOCUMENTS

| 3,739,217 | A | 6/1973 | Bergh et al. ............... 313/108 R |
| 4,902,356 | A | 2/1990 | Noguchi et al. ............ 148/33.4 |
| 4,912,532 | A | 3/1990 | Cook et al. ................ 357/16 |
| 4,946,547 | A | 8/1990 | Palmour et al. ............ 156/643 |
| 5,103,271 | A | 4/1992 | Izumiya et al. ............ 357/17 |
| 5,200,022 | A | 4/1993 | Kong et al. ............... 156/612 |

(Continued)

FOREIGN PATENT DOCUMENTS

| JP | 61059996 | 3/1986 |
| JP | 11238913 | 8/1999 |

(Continued)

OTHER PUBLICATIONS

Fujii T et al. "Increase in the Extraction Efficiency of GAN-Based Light-Emitting Diodes Via Surface Roughening", Applied Physics, Melville, NY, US, vol. 84, No. 6, Feb. 9, 2004, pp. 855-857.

(Continued)

*Primary Examiner* — Meiya Li
(74) *Attorney, Agent, or Firm* — Koppel, Patrick, Heybl & Philpott

(57) ABSTRACT

A light emitting diode (LED) includes a p-type layer of material, an n-type layer of material and an active layer between the p-type layer and the n-type layer. A roughened layer of transparent material is adjacent one of the p-type layer of material and the n-type layer of material. The roughened layer of transparent material has a refractive index close to or substantially the same as the refractive index of the material adjacent the layer of transparent material, and may be a transparent oxide material or a transparent conducting material. An additional layer of conductive material may be between the roughened layer and the n-type or p-type layer.

11 Claims, 7 Drawing Sheets

(56) References Cited

U.S. PATENT DOCUMENTS

| | | | |
|---|---|---|---|
| 5,376,580 A | 12/1994 | Kish et al. | 437/127 |
| RE34,861 E | 2/1995 | Davis et al. | 437/100 |
| 5,502,316 A | 3/1996 | Kish et al. | 257/94 |
| 5,985,687 A | 11/1999 | Bowers et al. | 438/46 |
| 6,071,795 A | 6/2000 | Cheung et al. | 438/458 |
| 6,258,699 B1 | 7/2001 | Chang et al. | 438/458 |
| 6,303,405 B1 | 10/2001 | Yoshida et al. | 438/46 |
| 6,365,429 B1 | 4/2002 | Kneissl et al. | 438/46 |
| 6,410,942 B1 | 6/2002 | Thibeault et al. | 257/88 |
| 6,420,199 B1 | 7/2002 | Coman et al. | 438/22 |
| 6,420,242 B1 | 7/2002 | Cheung et al. | 438/458 |
| 6,441,403 B1 | 8/2002 | Chang et al. | 257/94 |
| 6,448,102 B1 | 9/2002 | Kneissl et al. | 438/46 |
| 6,465,809 B1 | 10/2002 | Furukawa et al. | 257/94 |
| 6,468,824 B2 | 10/2002 | Chen et al. | 438/46 |
| 6,495,862 B1* | 12/2002 | Okazaki et al. | 257/103 |
| 6,559,075 B1 | 5/2003 | Kelly et al. | 438/795 |
| 6,562,648 B1 | 5/2003 | Wong et al. | 438/46 |
| 6,607,931 B2 | 8/2003 | Streubel | 438/22 |
| 6,657,236 B1 | 12/2003 | Thibeault et al. | 257/98 |
| 6,677,173 B2 | 1/2004 | Ota | 438/22 |
| 6,716,654 B2 | 4/2004 | Hsu et al. | 438/22 |
| 6,740,604 B2 | 5/2004 | Kelly et al. | 438/795 |
| 6,757,314 B2 | 6/2004 | Kneissl et al. | 372/50 |
| 6,786,390 B2 | 9/2004 | Yang et al. | 228/179.1 |
| 6,800,500 B2 | 10/2004 | Coman et al. | 438/22 |
| 6,806,112 B1 | 10/2004 | Horng et al. | 438/29 |
| 6,809,341 B2 | 10/2004 | Hsu et al. | 257/79 |
| 6,846,686 B2 | 1/2005 | Saeki et al. | 438/22 |
| 6,849,878 B2 | 2/2005 | Bader et al. | 257/103 |
| 7,037,738 B2 | 5/2006 | Sugiyama et al. | |
| 7,534,633 B2 | 5/2009 | Batres et al. | |
| 2002/0195609 A1* | 12/2002 | Yoshitake et al. | 257/81 |
| 2003/0062530 A1 | 4/2003 | Okazaki et al. | |
| 2003/0080344 A1* | 5/2003 | Yoo | 257/103 |
| 2003/0132445 A1* | 7/2003 | Yoshitake et al. | 257/84 |
| 2003/0173602 A1 | 9/2003 | Hsu et al. | |
| 2003/0178626 A1* | 9/2003 | Sugiyama et al. | 257/79 |
| 2004/0079947 A1* | 4/2004 | Lan et al. | 257/79 |
| 2004/0094772 A1 | 5/2004 | Hon et al. | |
| 2004/0161010 A1* | 8/2004 | Matsumura | 372/46 |
| 2004/0206969 A1* | 10/2004 | Orita | 257/97 |
| 2004/0211972 A1 | 10/2004 | Du et al. | |
| 2005/0023549 A1 | 2/2005 | Gardner et al. | |
| 2005/0082562 A1* | 4/2005 | Ou et al. | 257/103 |
| 2005/0093002 A1* | 5/2005 | Tsai et al. | 257/79 |
| 2005/0093008 A1 | 5/2005 | Suehiro | |
| 2005/0101080 A1 | 5/2005 | Choi et al. | |
| 2005/0104080 A1* | 5/2005 | Ichihara et al. | 257/98 |
| 2005/0211993 A1* | 9/2005 | Sano et al. | 257/79 |
| 2006/0054898 A1 | 3/2006 | Lai et al. | |
| 2006/0054907 A1 | 3/2006 | Lai | |
| 2006/0163586 A1* | 7/2006 | Denbaars et al. | 257/79 |
| 2008/0061311 A1* | 3/2008 | Denbaars et al. | 257/98 |

FOREIGN PATENT DOCUMENTS

| | | |
|---|---|---|
| JP | 2000196152 | 7/2000 |
| JP | 2002016286 | 1/2002 |
| JP | 2002335014 | 11/2002 |
| JP | 2003218383 | 7/2003 |
| JP | 2004311986 | 11/2004 |
| JP | 2005045054 | 2/2005 |
| JP | 2005191530 | 7/2005 |
| JP | 2005244202 | 9/2005 |
| JP | 2005327821 | 11/2005 |
| TW | 564584 B | 12/2003 |
| TW | 588469 B | 5/2004 |
| TW | 200408140 | 5/2004 |
| TW | 200514273 | 4/2005 |
| TW | M261838 U | 4/2005 |
| TW | M265766 U | 5/2005 |
| TW | I234301 | 6/2005 |
| TW | I234301 | 6/2005 |
| WO | 2005064666 | 7/2005 |

OTHER PUBLICATIONS

Written Opinion of IPEA, Date: May 23, 2008.
First Office Action re related Chinese Application No. 200680030998.3, dated: Mar. 6, 20091-6.
Third Office Action for counterpart Chinese Patent Application No. 200680030998.3 mailed Aug. 31, 2010.
Fourth Office Action for counterpart Chinese Patent Application No. 200680030998.3 issued Mar. 1, 2011.
Office Action from corresponding Korean Patent Application No. 10-2008-7004187, dated Sep. 28, 2012.
Office Action from Taiwanese counterpart application No. 095125858, dated Sep. 27. 2012.
Transparent Conducting Oxides, Ginley et al., Mrs Bulletin, Aug. 2000, pp. 15-65.
Windisch et al., *Impact of Texture-Enhanced Transmission on High-Efficiency Surface-Textured Light-Emitting Diodes*, Applied Physics Letters, vol. 79, No. 15, Oct. 8, 2001, pp. 2315-2317.
Schnitzer et al., *30% External Quantum Efficiency From Surface Textured, Thin-Film Light-Emitting Diodes*, Applied Physics Lett. 63(16), Oct. 18, 1993, pp. 2174-2176.
Windisch et al., *Light-Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.
Streusel et al., *High Brightness AlGaInP Light-Emitting Diodes*. IEEE Journal on Selected Topics in Quantum Electronics, vol. 8, No. 2, Mar./Apr. 2002, pp. 321-332.
Shor et al., *Direct Observation of Porous SiC Formed by Anodization in HF*, Appl. Phys. Lett. 62 (22), May 31, 1993, pp. 2836-2838.
Windisch et al., *40% Efficient Thin-Film Surface-Textured Light-Emitting Diodes by Optimization of Natural Lithography*, IEEE Transactions on Electron Devices, vol. 47, No. 7, Jul. 7, 2000. pp. 1492-1498.
Windisch et al., *Non-Resonant Cavity Light-Emitting Diodes*, In Light-Emitting Diodes: Research, Manufacturing, and Applications 1V, H. Walter Yao et al., Proceedings of SPIE vol. 3938 (2000), pp. 70-76.
Zangooie et al., *Surface, Pore Morphology, and Optical Properties of Porous 4H-SiC*, Journal of the Electrochemical Society, 148(6) G297-G302 (2001) Jan. 9, 2001.
Mimura et al, *Blue Electroluminescence From Porous Silicon Carbide*, Appl. Phys. Lett 65(26), Dec. 26, 1994, pp. 3350-3352.
Applied Physics Letters, Increase in the Extraction Efficiency of GAN-Based Light-Emitting Diodes Via Surface Roughening, Fujii et al., vol. 84, No. 6, Feb. 9, 2004, pp. 855-857.
Office Action from Taiwanese Patent Appl. No. 095125858 dated Apr. 15. 2013.
Final Notice of Rejection for Japanese Patent Application No. 2008-52293, dated May 11, 2012.
Decision of Rejection from Japanese Patent Appl. No. 2007-307066, dated Jun. 25, 2013.
Decision of Rejection from Japanese Patent Appl. No. 2007-307066. dated Jun. 25, 2013.
Second Office Action for counterpart Chinese Patent Application No. 200680030998.3 mailed May 14, 2010.
Office Action from Korean Patent Appl. No. 10-2008-7004187. dated Oct. 25, 2013.

* cited by examiner

ROUGHENED HIGH REFRACTIVE INDEX LAYER/LED FOR HIGH LIGHT EXTRACTION

BACKGROUND OF THE INVENTION

1. Field of the Invention

This invention relates to light emitting diodes (LEDs) and more particularly to new structures for enhancing the extraction of light from LEDs.

2. Description of Related Art

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree Inc., of Durham, N.C. and methods for producing them are set forth in the scientific literature as well as in U.S. Pat. Nos. Re. 34,861; 4,946,547; and 5,200,022.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient. LEDs with SiC substrates have relatively low light extraction efficiencies because the high index of refraction of SiC (approximately 2.7) compared to the index of refraction for the surrounding material, such as epoxy (approximately 1.5). This difference results in a small escape cone from which light rays from the active area can transmit from the SiC substrate into the epoxy and ultimately escape from the LED package.

Different approaches have been developed to reduce TIR and improve overall light extraction, with one of the more popular being surface texturing. Surface texturing increases the light's escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,410,942, assigned to Cree Lighting Company, discloses an LED structure that includes an array of electrically interconnected micro LEDs formed between first and second spreading layers. When a bias is applied across the spreaders, the micro LEDs emit light. Light from each of the micro LEDs reaches a surface after traveling only a short distance, thereby reducing TIR.

U.S. Pat. No. 6,657,236, also assigned to Cree Lighting Company, discloses structures for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light may reflect, refract, or scatter.

SUMMARY OF THE INVENTION

Briefly, and in general terms, the invention is directed to light emitting diodes (LEDs) that have regions for providing increased light extraction. In one of several aspects, the invention relates to an LED that includes a p-type layer of material, an n-type layer of material and an active layer between the p-type layer and the n-type layer. The LED also includes a roughened layer of transparent material that is adjacent one of the p-type layer of material and the n-type layer of material.

The invention also relates to an LED having a p-type layer of material, a n-type layer of material, an active layer between the p-type layer and the n-type layer and a layer of transparent conducting material that is adjacent one of the p-type layer of material and the n-type layer of material. The LED further includes a roughened layer of transparent material that is adjacent the transparent conducting layer.

In another aspect, the invention relates to an LED having a p-type layer of material, a n-type layer of material, an active layer between the p-type layer and the n-type layer and a layer of metallic conducting material that is adjacent one of the p-type layer of material and the n-type layer of material. The LED also includes a roughened layer of transparent material that is adjacent the layer of metallic material.

In several other aspects, the invention relates to processes of forming an LED. One process includes growing a base LED structure that includes a p-type layer of material, an n-type layer of material and an active layer between the p-type layer and the n-type layer. The process further includes depositing a layer of transparent material adjacent one of the p-type layer of material and the n-type layer of material and roughening the layer of transparent material.

Another process of forming an LED also includes growing a base LED structure that includes a p-type layer of material, an n-type layer of material and an active layer between the p-type layer and the n-type layer. The process also includes depositing a layer of transparent conducting material adjacent one of the p-type layer of material and the n-type layer of material and depositing a layer of transparent material adjacent the layer of transparent conducting material. The process further includes roughening the layer of transparent material.

Another process of forming an LED also includes growing a base LED structure that includes a p-type layer of material, an n-type layer of material and an active layer between the p-type layer and the n-type layer. Also included in this process is depositing a layer of metallic material adjacent one of the p-type layer of material and the n-type layer of material and depositing a layer of transparent material adjacent the layer of metallic material. The process further includes roughening the layer of transparent material.

These and other aspects and advantages of the invention will become apparent from the following detailed description and the accompanying drawings which illustrate by way of example the features of the invention.

DETAILED DESCRIPTION OF THE INVENTION

The present invention provides improved light extraction for light emitting diodes (LEDs) through a roughened layer of transparent material that is deposited directly on an LED surface having an associated LED contact. The roughened layer of transparent material has a refractive index close to or substantially the same as the refractive index of the LED material adjacent the layer of transparent material. The closeness of refractive indices ensures that a majority of light being emitted from the LED will cross from the LED material into the roughened layer of transparent material.

The layer of transparent material can be formed from a material with a high transparency and has a thickness that allows for the formation of a roughened surface sufficient to scatter light and increase light extraction. The layer of transparent material may be an electrically conductive material, in which case, electrical communication between the LED material and the associated LED contact is through the transparent layer.

In some according to the present invention, the roughened layer can be formed from a high transparent material that is not necessarily conductive. In these cases, electrical communication between the LED material and the associated LED contact may be provided through direct contact between the LED contact and the LED surface or alternatively, by providing an additional layer of conductive material between the roughened layer of transparent material and the LED surface. This additional layer may be a layer of transparent conducting material such as a layer of transparent conducting oxide (TCO) material or transparent metallic material. While the conductive material serves as an ohmic, current spreading contact for the LED contact, the additional layer of conductive material is generally less transparent than the roughened layer of transparent material and therefore is substantially thinner than the roughened layer.

Figure 1:
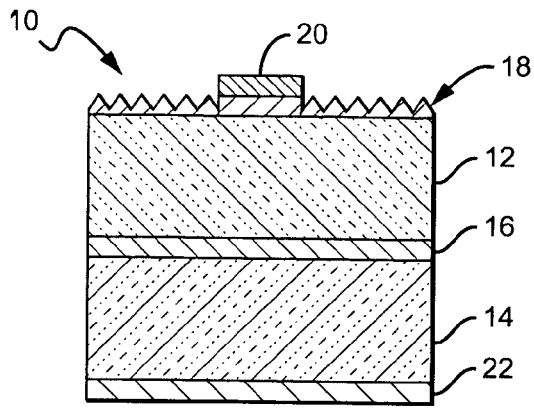
FIG. 1 is a sectional view of a p-side up LED having a light extraction region including a roughened layer of transparent material.

Referring now to the drawings and particularly to FIG. 1, there is shown a p-side up base LED structure 10 including a layer of p-type material 12, a layer of n-type material 14 and a layer of active material 16 sandwiched between the p-type layer and the n-type layer. A roughened light extracting region 18 is added to the base LED structure to form an LED having high light extraction properties. As described below, the roughened light extracting region 18 may take any one of several forms. A p-contact 20 is associated with the light extracting region 18 and an n-contact 22 is associated with the layer of n-type material.

The base LED structure may be fabricated from different material systems such as the Group III nitride based material systems. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. In a preferred embodiment, the p-type material and the n-type material is GaN and the active material is InGaN. In alternative embodiments the p-type and n-type materials may be AlGaN, AlGaAs or AlGaInP.

Figure 2A:
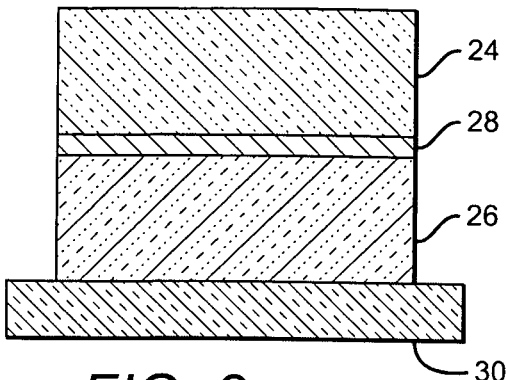
FIGS. 2a-2f are sectional views of various stages of a manufacturing process of an LED of FIG. 1, wherein the light extraction region includes a roughened layer of transparent material.

With reference to FIG. 2a, one embodiment of a high light extraction LED in accordance with the invention is formed by growing layers of p-GaN 24, n-GaN 26 and active materials 28 on a substrate 30. As shown, the n-GaN 26 is adjacent the substrate 30, the active materials 28 are on the n-GaN 26, and the p-GaN is on the active materials 28. In other embodiments the order of these layers can be different, with the p-GaN adjacent the substrate 30 and the n-GaN 26 being the top layer, with the active materials 28 between the two.

The substrate 30 can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree Research, Inc., of Durham, N.C. and methods for producing them are set forth in the scientific literature as well as in a U.S. Pat. Nos. Re. 34,861; 4,946,547; and 5,200,022.

Figure 2B:
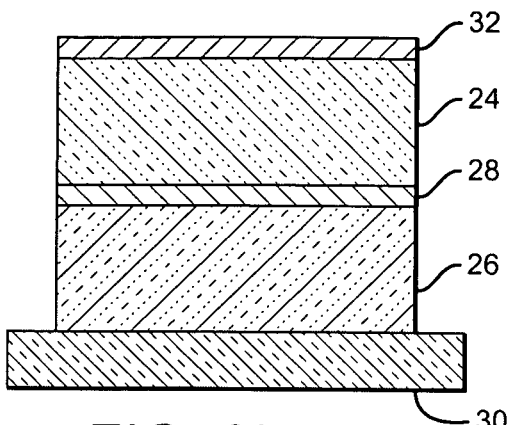

In one embodiment according to the present invention, the layers 24, 26, 28 are grown on the substrate 30 using metalorganic chemical vapor deposition (MOCVD). As shown in FIG. 2b, a layer of transparent material 32 is deposited directly on the surface of the p-type layer 24, also preferably by MOCVD. Using the same technique to both deposit the layer of transparent material 32 and grow the base LED structure layers 24, 26, 28 is advantageous in that it provides increased efficiency and cost reduction through the use of a single manufacturing system. Other methods of depositing the layer of transparent material 32 include sputtering and electron beam deposition.

Figure 2C:
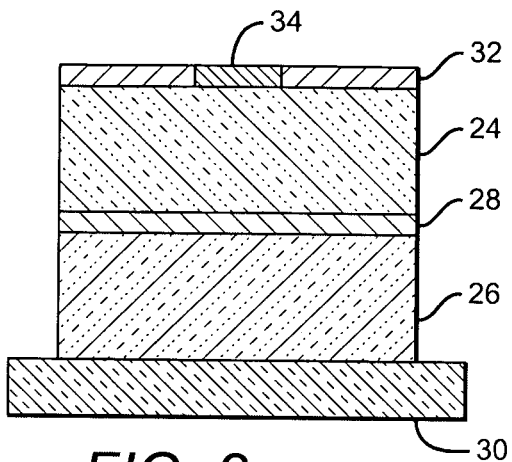
Figure 2D:
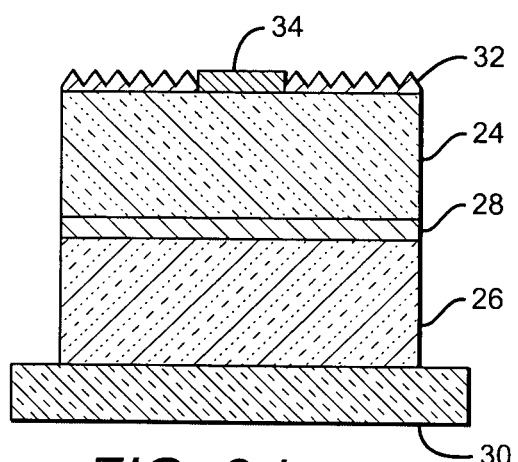
Figure 2E:
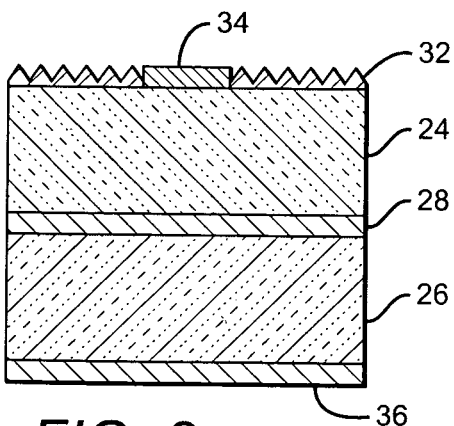
Figure 2F:
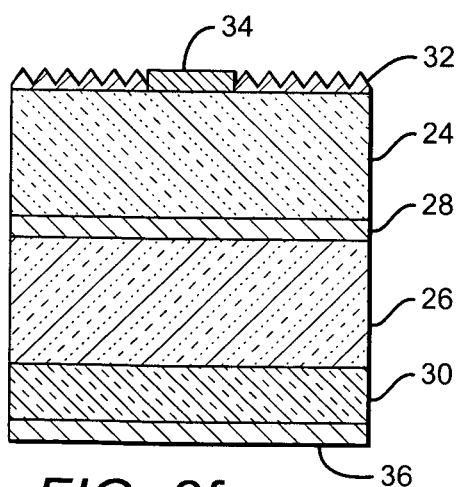

With reference to FIG. 2c, a portion of the layer of transparent material 32 is removed, for example by laser or chemical etching, and a p-contact 34 is formed adjacent the exposed portion of the p-GaN layer 24, using techniques well known in the art. As shown in FIG. 2d, the layer of transparent material 32 is then roughened using, for example a combination of photolithography to create a pattern and wet or dry photoelectrochemical (PEC) etching to create texture. With reference to FIGS. 2e and 2f, a n-contact 36 is added to the LED by either separating the substrate 30 from the n-type layer 26 by, for example a known laser lift off (LLO) process, and forming the n-contact on the n-type layer (FIG. 2e) or by forming the n-contact on the substrate (FIG. 2f). The former formation is used if the substrate 30 is formed of an insulating material such as AlN or sapphire. The latter formation may be used if the substrate 30 is formed of a conductive material such as SiC or GaN. As with the p-contact, the n-contact is formed using techniques well known in the art.

In this configuration, the light extracting region 18 (FIG. 1) of the LED includes the roughened layer of transparent material 32. In a preferred embodiment, a transparent material having an index of refraction close to or substantially the same as the p-type material is selected so that light passing through the p-type layer toward the junction between the p-type layer and the layer of transparent material passes through the junction into the transparent material without significant reflection. An exemplary quantitative measure of closeness between indices of refraction is ±0.3. Thus, for example, if the material of the p-type layer is GaN, with an index of refraction of approximately 2.45 (n≈2.45), the transparent material may have an index of refraction between 2.15 and 2.75. Possible materials having indices of refractions falling within this range include oxide materials, such as ZnO, MgO, $In_2O_3$, $TiO_2$, PbO, ZnSnO, NiO and indium tin oxide (ITO) and other materials, such as ZnS and CdS.

The layer of transparent material 32 can have many different thicknesses, with a typical thickness being in the range of 1000 to 15,000 angstrom (Å) and a preferred thickness being approximately 2,500 Å. These thicknesses allow for the formation of a roughened surface having geometric features of sufficient dimensions to enhance light extraction. Such geometric features may include, for example, pyramids, hemispheres or hexagonal cones. These geometric features reduce internal light reflection at the material/air interface and scatter the light outward.

Figure 3A:
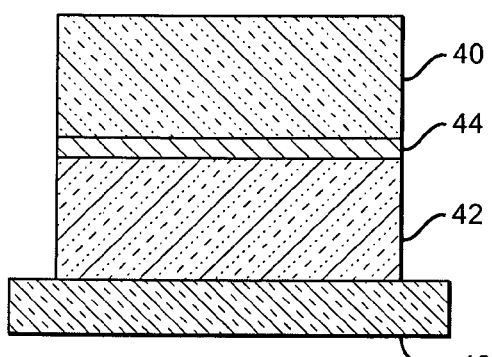
FIGS. 3a-3f are sectional views of various stages of a manufacturing process of an LED of FIG. 1, wherein the light extraction region includes a roughened layer of transparent conducting material.
Figure 3B:
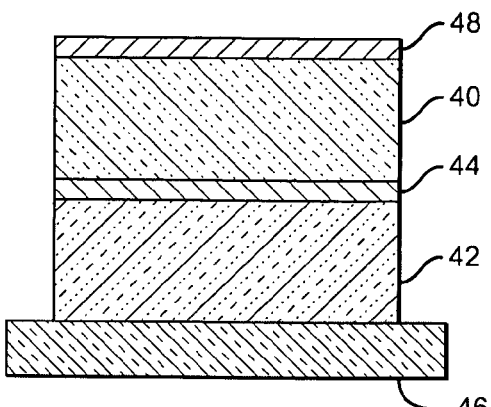

With reference to FIG. 3a, another embodiment of a high light extraction LED in accordance with the invention is also initially formed by growing layers of p-GaN 40, n-GaN 42 and active materials 44 on a substrate 46, with the layers in different embodiments being in different order and the substrate being many different materials as described above. In a preferred embodiment, the layers 40, 42, 44 are grown on the substrate 46 using MOCVD. As shown in FIG. 3b, a layer of transparent conducting material 48 is deposited directly on the top surface of p-type layer 40, also preferably by MOCVD. Other methods of depositing the transparent conducting layer 48 include sputtering and electron beam deposition.

Figure 3C:
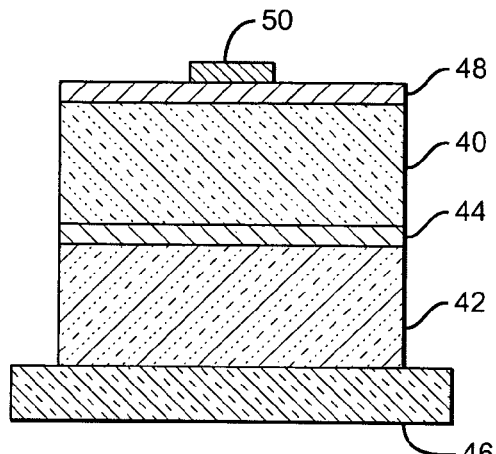
Figure 3D:
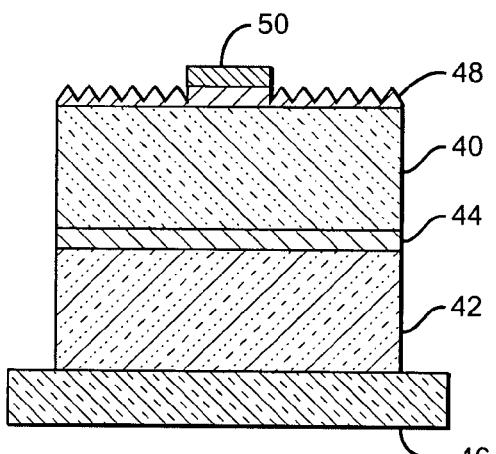
Figure 3E:
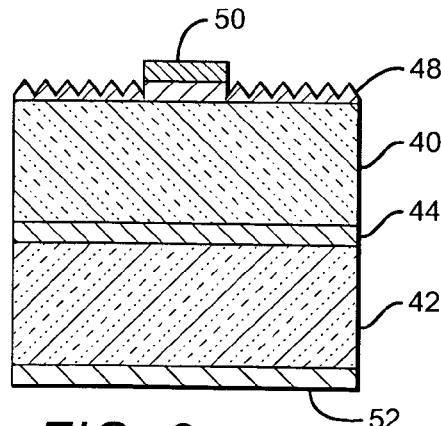
Figure 3F:
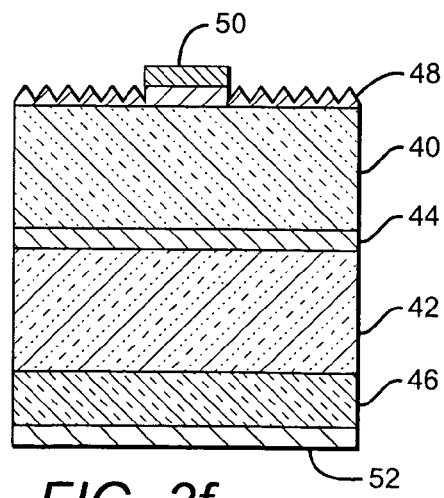

With reference to FIG. 3c, a p-contact 50 can be formed adjacent the transparent conducting layer 48. As shown in FIG. 3d, the transparent conducting layer 48 surrounding the p-contact 50 can then roughened using, for example PEC etching. As shown in FIGS. 3e and 3f, a n-contact 52 can be added to the LED by either separating the substrate 46 from the n-type layer 42 using a LLO process and forming the n-contact on the n-type layer (FIG. 3e) or, in the case of a conductive substrate 46, by forming the n-contact on the substrate (FIG. 3f).

In this configuration, the light extracting region 18 (FIG. 1) of the LED includes the roughened transparent conducting layer 48. As with the previously described embodiment, the transparent conducting layer is preferably formed of a material having an index of refraction close to or substantially the same as the material of the p-type layer 40. Examples of such transparent conducting materials include but are not limited to transparent conducting oxides (TCOs), such as $Ga_2O_3$, InO, ZnO, $In_2O_3$ and ITO. The transparent conducting layer 48 can provide a more even distribution of current across the p-type and n-type layers and thus a more even generation of light within the active region.

The transparent conducting layer 48 can have many different thicknesses, with a typical thickness being in the range of 1,000 to 15,000 Å, and a preferred thickness being approximately 2,500 Å. These thicknesses allow for both the formation of a roughened surface having geometric features of sufficient dimensions to enhance light extraction, and a remaining layer of transparent conducting material adjacent the p-type layer 40 for current distribution purposes.

Figure 4A:
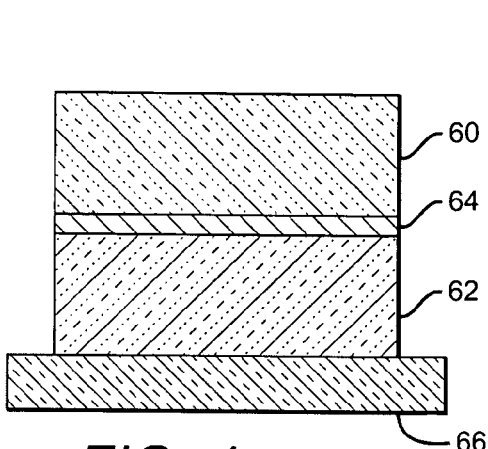
FIGS. 4a-4f are sectional views of various stages of a manufacturing process of an LED of FIG. 1, wherein the light extraction region includes a layer of transparent conducting material and a roughened layer of transparent material.
Figure 4B:
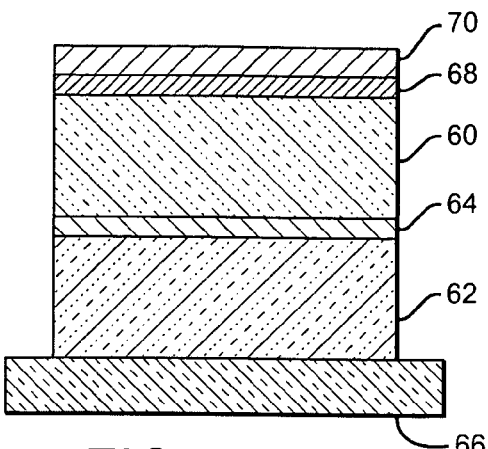

With reference to FIG. 4a, another configuration of a high light extraction LED in accordance with the invention is also initially formed by growing layers of p-GaN 60, n-GaN 62 and active materials 64 on a substrate 66, with the layers in other embodiment being in different order and the substrate being made of different materials as described above. In one embodiment, the layers 60, 62, 64 are grown on the substrate 66 using MOCVD. As shown in FIG. 4b, a layer of transparent conducting material 68 is directly deposited on the top surface of the p-type layer 60. A layer of transparent material 70 is deposited directly on the top surface of the transparent conducting layer 68. The deposition of the transparent conducting layer 68 and the transparent material 70 is preferably done by MOCVD. Other methods of depositing the layers 68, 70 include sputtering and electron beam deposition.

Figure 4C:
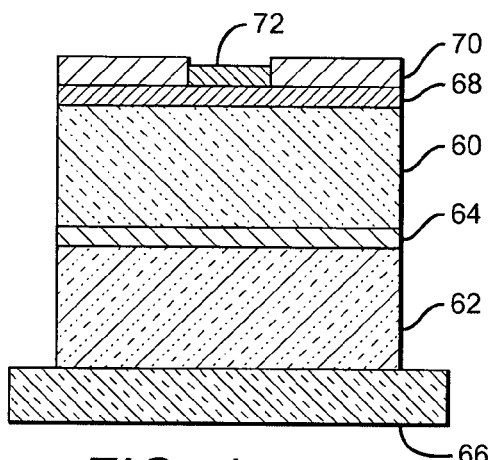
Figure 4D:
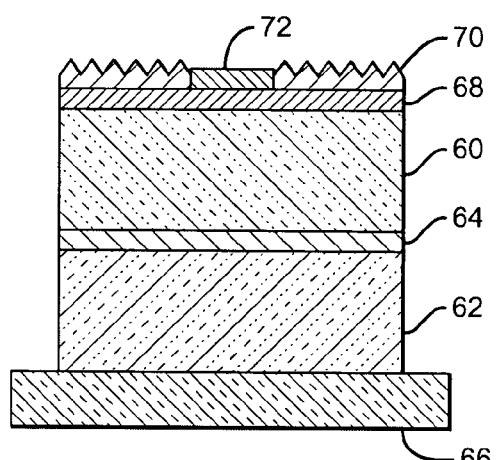
Figure 4E:
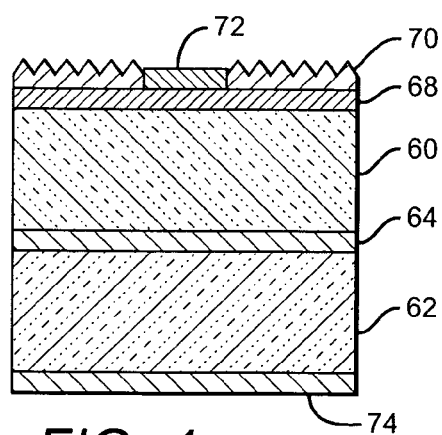
Figure 4F:
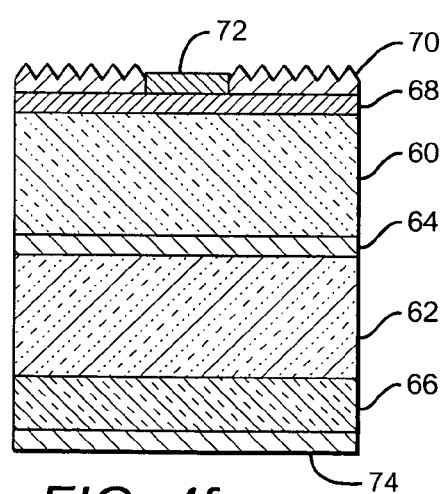

With reference to FIG. 4c, a portion of the layer of transparent material 70 is removed, for example by laser or chemical etching, and a p-contact 72 is formed adjacent the exposed portion of the transparent conducting layer 68. As shown in 4d, the layer of transparent material 70 surrounding the p-contact 72 can then roughened using, for example PEC etching. With reference to FIGS. 4e and 4f, as with previously described configurations, a n-contact 74 can be added to the LED by either separating the substrate 66 from the n-type layer 62 and forming the n-contact on the n-type layer (FIG.

4e) or, in the case of a conducting substrate, by forming the n-contact on the substrate (FIG. 4f).

In this configuration, the light extracting region 18 (FIG. 1) of the LED includes the roughened layer of transparent material 70 and the transparent conducting layer 68. The transparent conducting layer 68 provides a more even distribution of current across the p-type and n-type layers and thus a more even generation of light within the active region, while the layer of transparent material 70 provides a platform for a higher transparency material relative to the transparent conducting layer.

Both the transparent conducting layer 68 and the layer of transparent material 70 can be formed from materials having indices of refraction close to or substantially the same as the material of the p-type layer. Similar to above, examples of transparent conducting materials include $Ga_2O_3$, InO, ZnO, $In_2O_3$ and ITO. Possible materials for the layer of transparent material 70 include oxide materials, such as ZnO, MgO, $In_2O_3$, $TiO_2$, PbO, ZnSnO, NiO and ITO, and other materials, such as ZnS and CdS. While the transparent conducting layer 68 and the layer of transparent material 70 may be formed of the same material, in a preferred embodiment, the layer of transparent material is formed from a material having a higher level of transparency than the material of the transparent conducting layer.

Transparent conducting layer 68 and the layer of transparent material 70 can also be many different thicknesses, with a typical range of thicknesses for both being 1,000 to 15,000 Å. The transparent conducting layer 68 is thick enough to perform its current distribution function while being thin enough so its lower transparency does not degrade light extraction. The layer of transparent material 70 is typically thicker than the transparent conducting layer 68 in order to allow for the formation of a roughened surface having geometric features of sufficient dimensions to enhance light extraction.

Figure 5A:
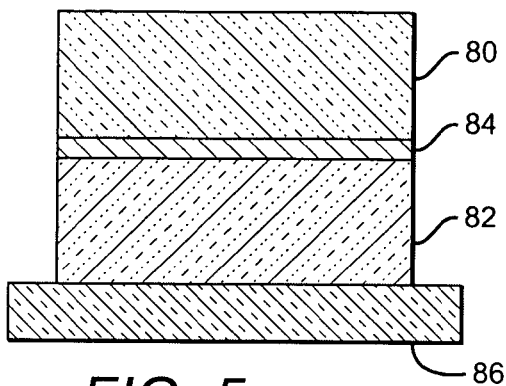
FIGS. 5a-5f are sectional views of various stages of a manufacturing process of an LED of FIG. 1, wherein the light extraction region includes a layer of metallic material and a roughened layer of transparent material.
Figure 5B:
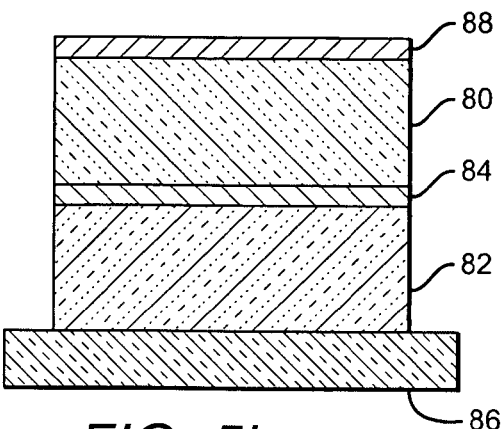

With reference to FIG. 5a, another configuration of a high light extraction LED in accordance with the invention is also initially formed by growing layers of p-GaN 80, n-GaN 82 and active materials 84 on a substrate 86 in the same order as shown or in a different order. The substrate can be made of many different materials as described above, and in a preferred embodiment, the layers 80, 82, 84 can be grown on the substrate 86 using MOCVD. As shown in FIG. 5b, a thin layer of metallic material 88 is deposited on the p-type layer 80. The metallic material 88 serves as an ohmic, current spreading contact and is preferably formed of a semi-transparent metal such as Pd, Pt, Pd/Au, Pt/Au, Ni/Au, NiO/Au or any alloy thereof. The deposition of the metallic layer may be done using MOCVD or other well known methods including, for example, sputtering and electron beam deposition.

Figure 5C:
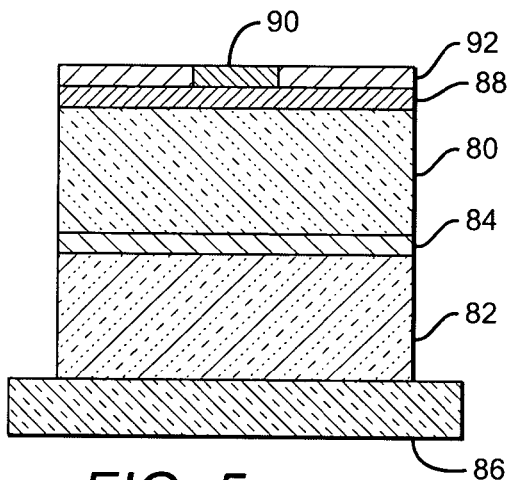
Figure 5D:
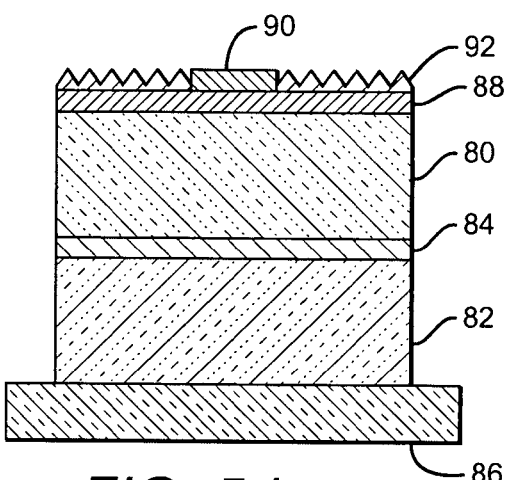
Figure 5E:
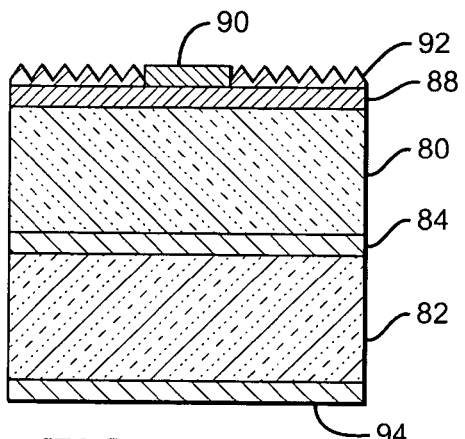
Figure 5F:
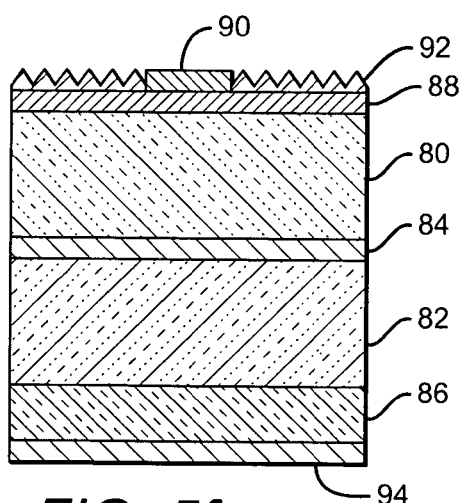

With reference to FIG. 5c, a p-contact 90 is formed adjacent the layer of metallic material 88 and a layer of transparent material 92 is deposited around the p-contact. The layer of transparent material 92 may be deposited using MOCVD or other well known methods including, for example, sputtering and electron beam deposition. As shown in 5d, the layer of transparent material 92 surrounding the p-contact 90 is then roughened using, for example PEC etching. With reference to FIGS. 5e and 5f, as with previously described configurations, a n-contact 94 is added to the LED by either separating the substrate 86 from the n-GaN layer 82 by a LLO process and forming the n-contact on the n-GaN layer (FIG. 5e) or by forming the n-contact on the substrate (FIG. 5f).

In this configuration, the light extracting region 18 (FIG. 1) of the LED includes the layer of metallic material 88 and the roughened layer of transparent material 92.

As with previous configurations, the layer of transparent material 92 is preferably formed from a material having an index of refraction close to or substantially the same as the material of the p-type layer. Possible materials for the layer of transparent material 92 include oxide materials, such as ZnO, MgO, $In_2O_3$, $TiO_2$, PbO, ZnSnO, NiO and ITO, and other materials, such as ZnS and CdS.

Regarding the relative thickness of the layer of metallic material 88 and the layer of transparent material 92, the thickness of the layer of metallic material 88 is generally in the range of 10 to 1000 Å while the thickness of the layer of transparent material 70 is generally in the range of 1000 to 15,000 Å. In one embodiment the metallic layer is approximately 100 angstroms thick. The layer of metallic material 88 is typically just thick enough to perform its current distribution function while being thin enough so that it semi-transparent nature does not significantly degrade light extraction. The layer of metallic material 88 can be made of many different materials, including but not limited to Pd, Au, and NiAu. The layer of transparent material 92 is typically thicker than the layer of metallic material 88 in order to allow for the formation of a roughened surface having geometric features of sufficient dimensions to enhance light extraction.

Figure 6:
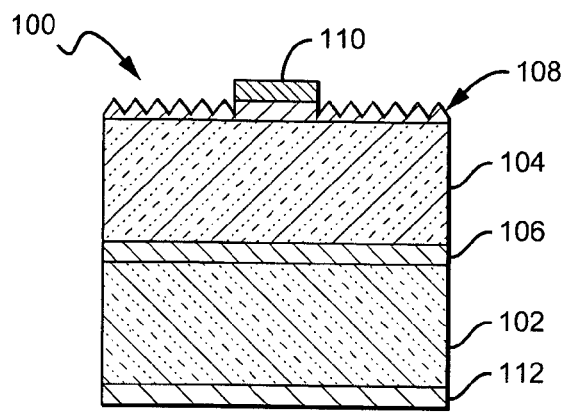
FIG. 6 is a sectional view of a n-side up LED having a light extraction region including a roughened layer of transparent material.

Referring now to FIG. 6, there is shown an n-side up LED structure 100 including a layer of p-type material 102, a layer of n-type material 104 and a layer of active material 106 sandwiched between the p-type layer and the n-type layer. The LED structure 100 also includes a roughened light extracting region 108 which, as described below, may take any one of several forms. An n-contact 110 is associated with the light extracting region 108 and a p-contact 112 is associated with the layer of p-type material. In a preferred embodiment, the p-type material and the n-type material is GaN and the active material is InGaN. In alternative embodiments the p-type and n-type materials may be AlGaN, AlGaAs or AlGaInP.

Figure 7A:
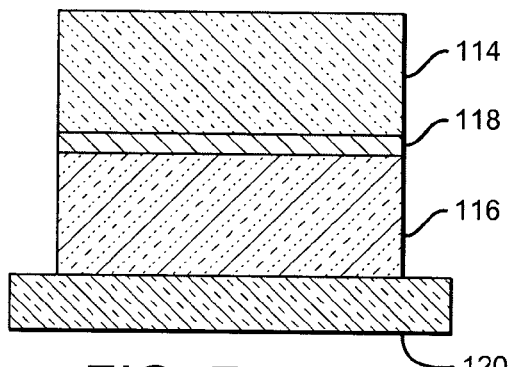
FIGS. 7a-7d are sectional views of various stages of a manufacturing process of a base LED structure of FIG. 6.
Figure 7B:
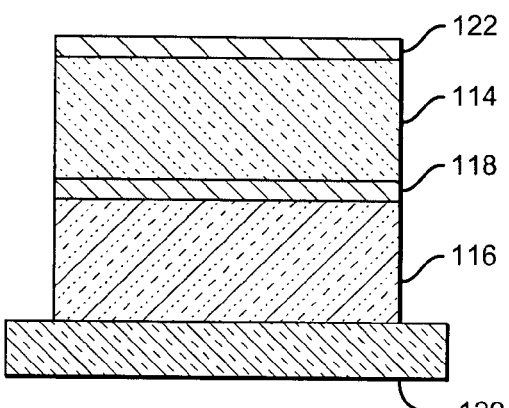

With reference to FIG. 7a, an LED base structure is formed by growing layers of p-GaN 114, n-GaN 116 and active materials 118 on a substrate 120 that can be made of the substrate materials described above. In a preferred embodiment, the layers 114, 116, 118 are grown on either a substrate 120 using MOCVD. As shown in FIG. 7b a p-contact 122 is formed on the layer of p-type material 114.

Figure 7C:
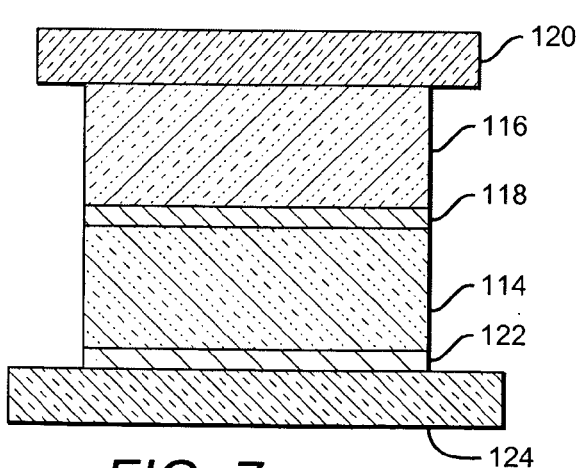
Figure 7D:
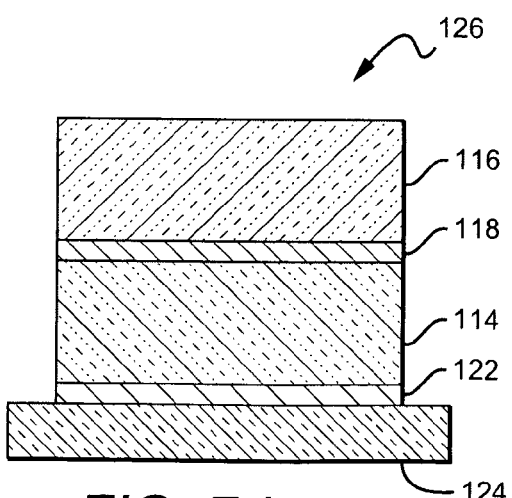

With reference to FIG. 7c, the structure is flipped and bonded to a submount 124. The submount 124 may be many different structures made from different materials, for example, an Au-coated Si submount. The substrate 120 shown in FIG. 7c can be debonded from the n-type layer 116 leaving the LED base structure 126 shown in FIG. 7d. The substrate 120 may be removed by many known processes including a LLO process. As described below, any one of several roughened light extracting regions 118 may be added to the LED base structure 126 to form an LED having high light extraction properties.

Figure 8A:
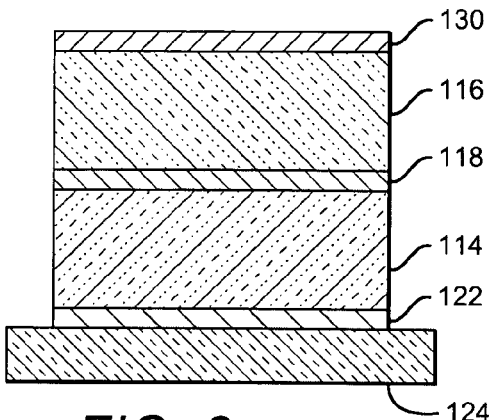
FIGS. 8a-8c are sectional views of various stages of a manufacturing process of an LED of FIG. 6, wherein the light extraction region includes a roughened layer of transparent material.

As shown in FIG. 8a, one configuration of a high light extraction LED in accordance with the invention is formed by depositing a layer of transparent material 130 directly on the top surface of the n-type layer 116 of the base LED structure. The layer of transparent material 130 may be deposited by using any one of several methods including MOCVD, sputtering and electron beam deposition.

Figure 8B:
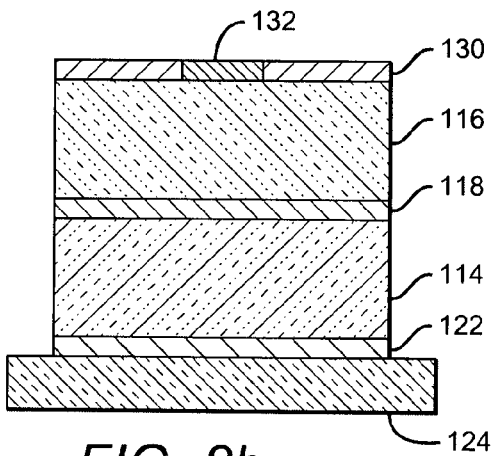
Figure 8C:
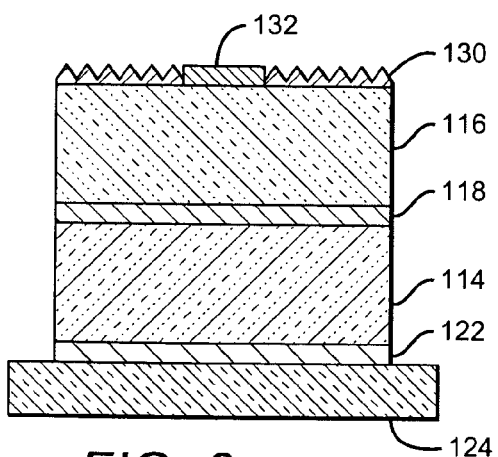

With reference to FIG. 8b, a portion of the layer of transparent material 130 is removed, for example by laser or chemical etching, and a n-contact 132 is formed adjacent the exposed portion of the n-type layer 116. As shown in FIG. 8c, the layer of transparent material 130 is then roughened using, for example PEC etching.

In this configuration, the light extracting region 108 (FIG. 6) of the LED includes the roughened layer of transparent material 130. This roughened layer of transparent material 130 has the same properties as previously described with respect to the configuration of FIGS. 2a-2f.

Figure 9A:
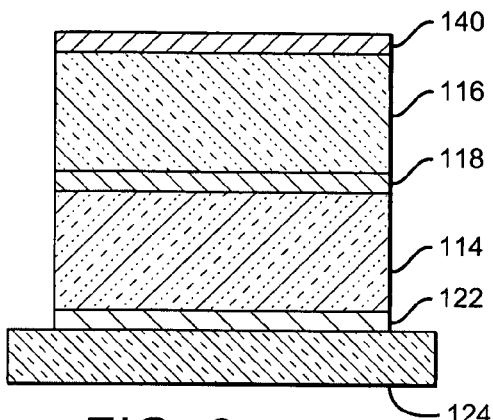
FIGS. 9a-9c are sectional views of various stages of a manufacturing process of an LED of FIG. 6, wherein the light extraction region includes a roughened layer of transparent conducting material.

As shown in FIG. 9a, another configuration of a high light extraction LED in accordance with the invention is formed by depositing a layer of transparent conducting material 140 directly on the top surface of the n-type layer 116 of a base LED structure. The transparent conducting layer 140 may be deposited using any one of several methods including MOCVD, sputtering and electron beam deposition.

Figure 9B:
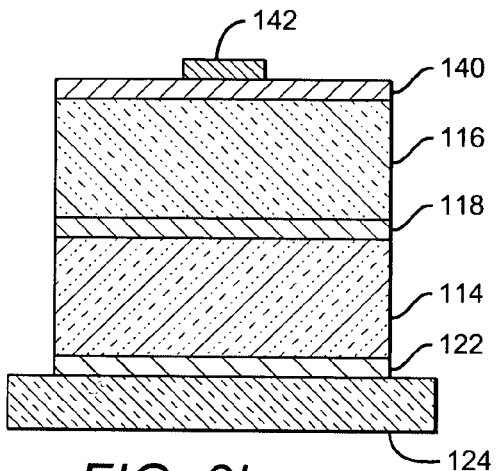
Figure 9C:
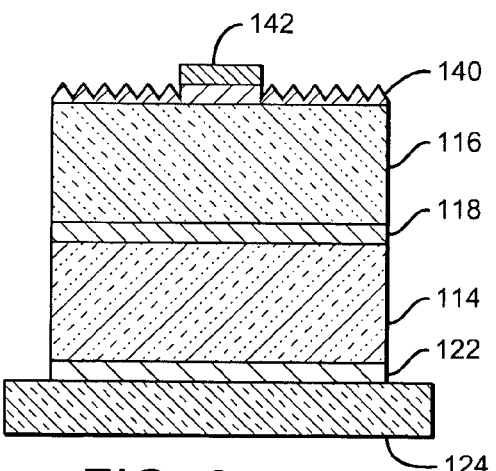

With reference to FIG. 9b, an n-contact 142 is formed adjacent the transparent conducting layer 140. As shown in FIG. 9c, the transparent conducting layer 140 is then roughened using, for example PEC etching.

In this configuration, the light extracting region 108 (FIG. 6) of the LED includes the roughened transparent conducting layer 140. This roughened transparent conducting layer 140 has the same properties as previously described with respect to the configuration of FIGS. 3a-3f.

Figure 10A:
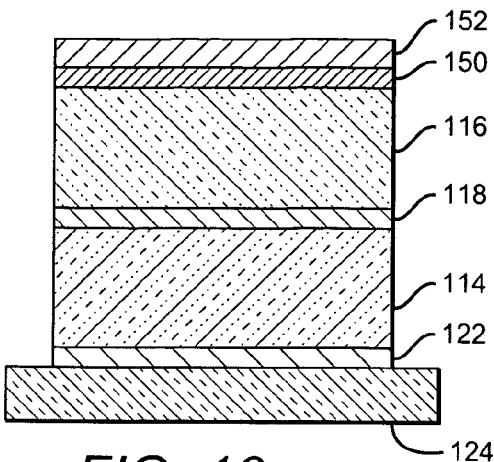
FIGS. 10a-10c are sectional views of various stages of a manufacturing process of an LED of FIG. 6, wherein the light extraction region includes a layer of transparent conducting material and a roughened layer of transparent material.

As shown in FIG. 10a, another configuration of a high light extraction LED in accordance with the invention is formed by depositing a layer of transparent conducting material 150 directly on the top surface of the n-type layer 116 of a base LED structure. A layer of transparent material 152 is directly deposited on the transparent conducting layer 150. The deposition of the transparent conducting layer 150 and the transparent material 152 is preferably done by MOCVD. Other possible methods of depositing the layers 150, 152 include sputtering and electron beam deposition.

Figure 10B:
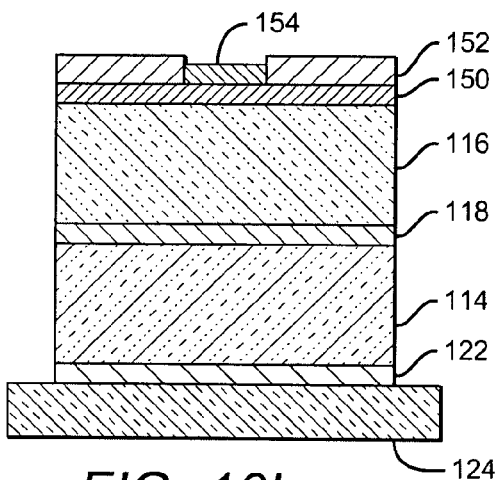

With reference to FIG. 10b, a portion of the layer of transparent material 152 is removed, for example by laser or chemical etching, and a n-contact 154 is formed adjacent the exposed portion of the transparent conducting layer 150. As shown in 10c, the layer of transparent material 152 surrounding the n-contact 154 is then roughened using, for example PEC etching.

In this configuration, the light extracting region 108 of the LED includes the roughened layer of transparent material 152 and the transparent conducting layer 150. This roughened layer of transparent material 152 and the transparent conducting layer 150 have the same properties as previously described with respect to the configuration of FIGS. 4a-4f.

Figure 11A:
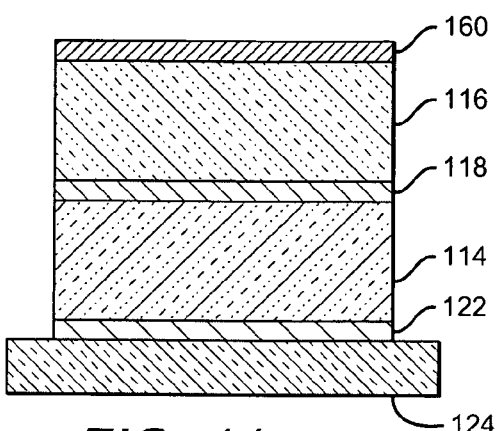
FIGS. 11a-11c are sectional views of various stages of a manufacturing process of an LED of FIG. 6, wherein the light extraction region includes a layer of metallic material and a roughened layer of transparent material.

With reference to FIG. 11a, another configuration of a high light extraction LED in accordance with the invention is formed by depositing a thin layer of metallic material 160 on the n-type layer 116 of a base LED structure. The layer is preferably formed of a semi-transparent metal such as Pd, Pt, Pd/Au, Pt/Au, Ni/Au, NiO/Au or any alloy thereof. The deposition of the metallic layer may be done using MOVCD or other well known methods including, for example, sputtering and electron beam deposition.

Figure 11B:
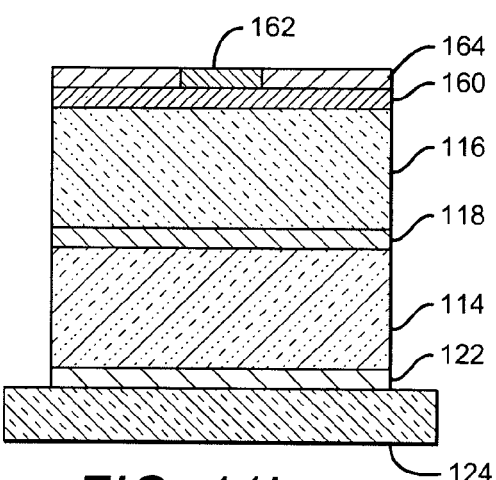
Figure 10C:
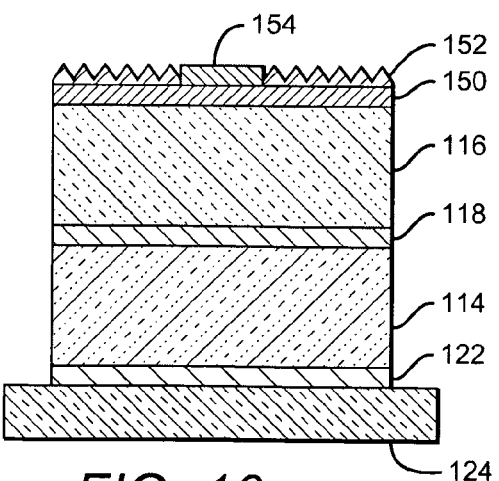
Figure 11C:
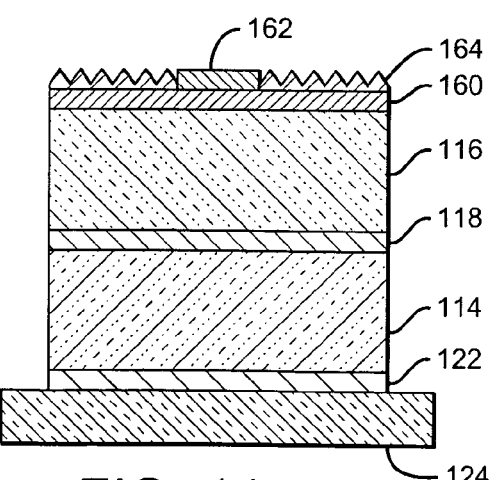

Next, with reference to FIG. 11b, an n-contact 162 is formed adjacent the layer of metallic material 160 and a layer of transparent material 164 is deposited around the n-contact. The layer of transparent material 164 may be deposited using MOVCD or other well known methods including, for example, sputtering and electron beam deposition. As shown in FIG. 11c, the layer of transparent material 164 surrounding the n-contact 162 is then roughened using, for example PEC etching.

In this configuration, the light extracting region 108 (FIG. 6) of the LED includes the layer of metallic material 160 and the roughened layer of transparent material 164. This layer of metallic material 160 and the roughened layer of transparent material 164 have the same properties as previously described with respect to the configuration of FIGS. 5a-5f.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A vertical light emitting diode (LED), said LED comprising:
    a plurality of semiconductor layers, comprising:
        a p-type layer of material;
        an n-type layer of material; and
        an active layer between the p-type layer and the n-type layer;
    a roughened layer of transparent oxide material comprising a flat bottom surface adjacent to said plurality of semiconductor layers, wherein said roughened layer of transparent oxide material has a refractive index of within approximately ±0.3 of the refractive index of said plurality of semiconductor layers, said roughened layer of transparent oxide material arranged on a primary emission surface of said LED;
    a cavity within said roughened layer of transparent oxide material;
    a first contact disposed within said cavity and surrounded by said roughened layer of transparent oxide material, wherein said first contact and said flat bottom surface of said roughened layer are in direct contact and planar with one end of said plurality of semiconductor layers; and
    a second contact in electrical contact with the opposite end of said plurality of semiconductor layers;
    wherein the roughened layer of transparent oxide material comprises at least one of ZnO, MgO, $In_2O_3$, PbO, ZnSnO, NiO and indium tin oxide (ITO); and
    wherein the roughened layer of transparent oxide material comprises a roughened layer of transparent conducting oxide material.

2. The LED of claim 1 wherein the roughened layer of transparent oxide material is adjacent the n-type layer of material.

3. The LED of claim 2 wherein said first contact is a n-type contact.

4. The LED of claim 1 wherein the roughened layer of transparent conducting oxide material comprises at least one of ZnO, $In_2O_3$ and indium tin oxide (ITO).

5. The LED of claim 1 wherein the roughened layer of transparent oxide material is adjacent the p-type layer of material.

6. The LED of claim 5 wherein said first contact is a p-type contact.

7. A vertical geometry light emitting diode (LED), said LED comprising:
    a plurality of semiconductor layers, comprising:
        a first layer of doped semiconductor material;
        a second layer of doped semiconductor material;
        an active layer sandwiched between said first and second layers of doped semiconductor material;
        a first contact on and in direct contact with one of said first and second layers of doped semiconductor material; and
        a second contact on the other of said first and second layers of doped semiconductor material, wherein said first and second contacts are on opposite sides of said plurality of semiconductor layers; and a separate roughened layer of transparent oxide material comprising a flat bottom surface adjacent and planar with one of the plurality of semiconductor layers, wherein said roughened layer of transparent oxide material has a refractive index of within approximately ±0.3 of the refractive index of the adjacent one of the plurality of semiconductor layers, said roughened layer of transparent oxide material arranged on a primary emission surface of said LED, wherein said first contact is surrounded by said roughened layer of transparent oxide material;

wherein the roughened layer of transparent oxide material comprises at least one of ZnO, MgO, In$_2$O$_3$, PbO, ZnSnO, NiO and indium tin oxide (ITO); and wherein the roughened layer of transparent oxide material comprises a roughened layer of transparent conducting oxide material.

8. A vertical light emitting diode (LED), said LED comprising:

a plurality of semiconductor layers, comprising:
  a first layer of doped semiconductor material comprising a planar surface;
  a second layer of doped semiconductor material also comprising a planar surface;
  an active layer sandwiched between said first and second layers of doped semiconductor material;

a separate roughened layer of transparent oxide material comprising a flat bottom surface on and in direct contact with the planar surface of one of said first and second layers of doped semiconductor material, said roughened layer of transparent oxide material comprising an index of refraction ±0.3 of said plurality of semiconductor layers; and a first contact in direct contact with one of said semiconductor layers and surrounded by said roughened layer of transparent oxide material;

wherein the roughened layer of transparent oxide material comprises at least one of ZnO, MgO, In$_2$O$_3$, PbO, ZnSnO, NiO and indium tin oxide (ITO); and wherein the roughened layer of transparent oxide material comprises a roughened layer of transparent conducting oxide material.

9. The LED of claim 8 further comprising said first contact in electrical contact with said first layer of doped semiconductor material and a second contact in electrical contact with said second layer of doped semiconductor material on a side of said LED opposite from said first contact, wherein said LED has vertical geometry with said first and second contacts on opposite sides of said plurality of semiconductor layers.

10. A vertical light emitting diode (LED), said LED comprising:

a plurality of semiconductor layers, comprising:
  a p-type layer of material;
  an n-type layer of material; and
  an active layer between the p-type layer and the n-type layer;

a roughened layer comprising indium tin oxide (ITO) and further comprising a flat bottom surface adjacent and planar with a primary emission surface of said LED, wherein said roughened layer of ITO has a refractive index within approximately ±0.3 of the refractive index of said p-type layer;

a cavity within said roughened layer of ITO, a first contact disposed within said cavity, wherein said first contact and said roughened layer of ITO are in direct contact with said p-type layer, and a second contact in electrical contact with the said n-type layer; and wherein the roughened layer comprises a transparent and conductive roughened layer.

11. A vertical light emitting diode (LED), said LED comprising:

a plurality of semiconductor layers, comprising:
  a p-type layer of material;
  an unroughened n-type layer of material; and
  an active layer between the p-type layer and the re-type layer;

a roughened layer comprising indium tin oxide (ITO) and further comprising a flat bottom surface adjacent and planar with a primary emission surface of said LED, wherein said roughened layer of ITO has a refractive index of within approximately ±0.3 of the refractive index of said n-type layer; and a cavity within said roughened layer of ITO, a first contact disposed within said cavity, wherein said first contact and said roughened layer of ITO are in direct contact with said n-type layer, and a second contact in electrical contact with the said p-type layer;

wherein the roughened layer comprises a transparent and conductive layer.

* * * * *